(12) United States Patent
Wada

(10) Patent No.: US 8,325,533 B2
(45) Date of Patent: Dec. 4, 2012

(54) SEMICONDUCTOR DEVICE USING CHARGE PUMP CIRCUIT

(75) Inventor: Masahiro Wada, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 307 days.

(21) Appl. No.: 12/846,446

(22) Filed: Jul. 29, 2010

(65) Prior Publication Data

US 2011/0026329 A1    Feb. 3, 2011

(30) Foreign Application Priority Data

Aug. 3, 2009    (JP) .................................. 2009-180984

(51) Int. Cl.
*G11C 16/04*    (2006.01)
(52) U.S. Cl. ......... 365/185.18; 365/189.11; 365/189.09; 327/536; 327/537; 327/538
(58) Field of Classification Search ............. 365/185.18, 365/189.11, 189.09; 327/536, 537, 538
See application file for complete search history.

(56) References Cited

U.S. PATENT DOCUMENTS

| 5,874,851 A * | 2/1999 | Shiota ........................... 327/537 |
| 2001/0000133 A1* | 4/2001 | Noda et al. .................... 365/226 |
| 2009/0160532 A1* | 6/2009 | Wu et al. ....................... 327/536 |

FOREIGN PATENT DOCUMENTS

| JP | 02-076251 A | 3/1990 |
| JP | 2003-338553 A | 11/2003 |

* cited by examiner

*Primary Examiner* — Connie Yoha
(74) *Attorney, Agent, or Firm* — Sughrue Mion, PLLC

(57) ABSTRACT

A semiconductor device including a plurality of capacitance units connected in parallel between a first voltage and a second voltage. Each of the plurality of capacitance units includes: a capacitance element connected with the first voltage; and a capacitance disconnecting circuit connected between the second voltage and the capacitance element. The capacitance disconnecting circuit includes a non-volatile memory cell with a threshold voltage changed based on a change of a leakage current which flows from the capacitance element, and blocks off the leakage current based on a rise of the threshold voltage of the non-volatile memory cell when the leakage current exceeds a predetermined value.

18 Claims, 13 Drawing Sheets

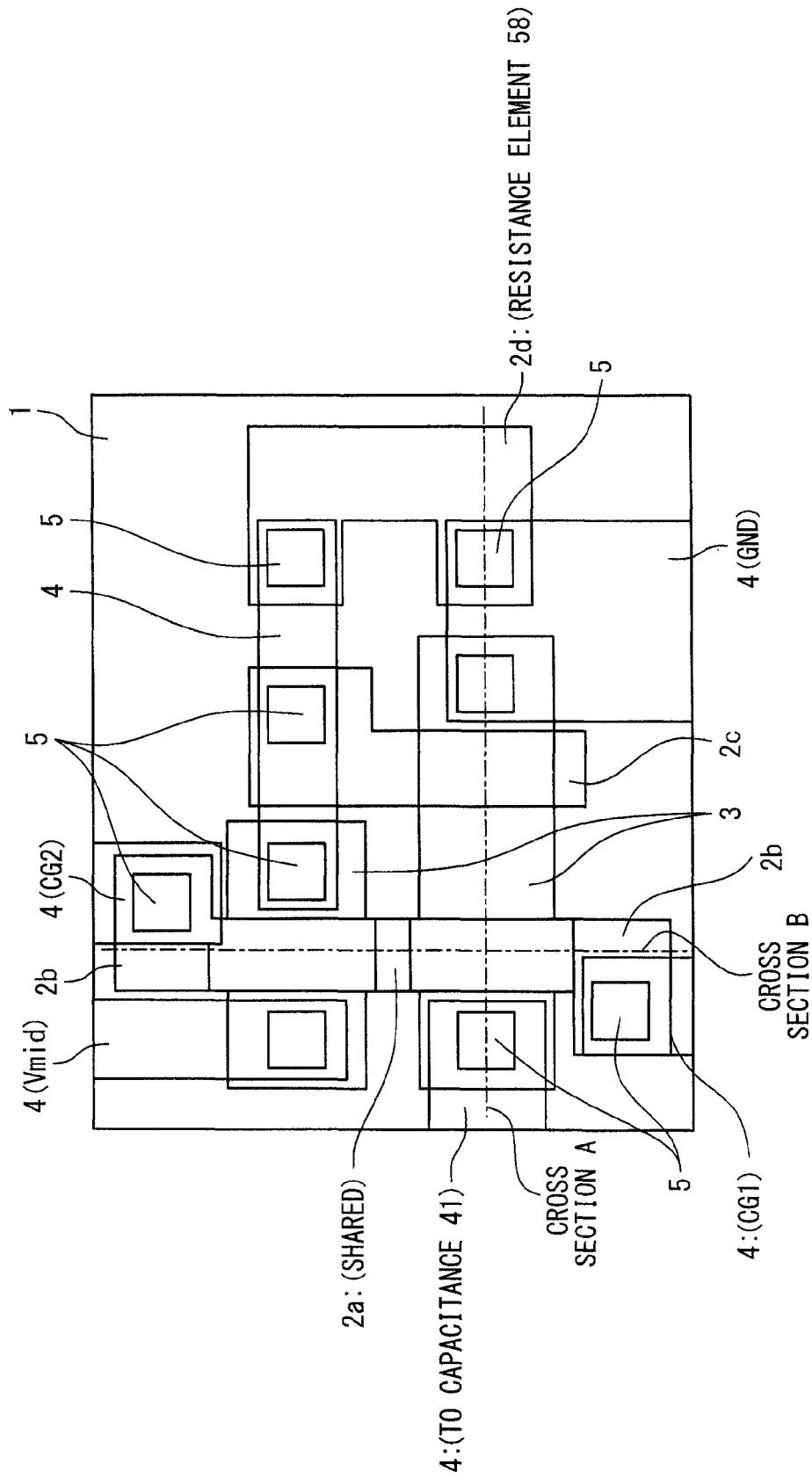

SEMICONDUCTOR DEVICE USING CHARGE PUMP CIRCUIT

INCORPORATION BY REFERENCE

This patent application claims a priority based on Japanese Patent Application No. 2009-180984 filed on Aug. 3, 2009. The disclosure thereof is incorporated herein by reference.

TECHNICAL FIELD

The present invention relates to a semiconductor device on which a large scale capacitance unit is mounted.

BACKGROUND ART

With recent process miniaturization, the number of processing steps necessary to manufacture a nonvolatile memory such as a flash memory has been increasing. Increases in the numbers of times of deposition, etching, and exposure cause more defects on a semiconductor substrate, and therefore it becomes difficult to ensure reliability of a capacitance element including a gate oxide film on semiconductor substrate.

For example, JP-A-Heisei 2-76251 (Patent Literature 1) discloses a technique that automatically prevents defective operation due to insulation breakdown in a device including a large scale capacitance unit such as a charge pump circuit. A polysilicon electrode PSi divided into a plurality of sections is present on the surface of a semiconductor substrate, and an oxide film is present between the polysilicon electrode sections PSi and the semiconductor substrate, to form a capacitance. The polysilicon electrode sections are connected with narrow aluminum wiring lines Al.

In an ordinary state, the polysilicon electrode sections are all connected with a same wiring line, and therefore the plurality of electrode sections can operate as an integrated capacitance element. If an oxide film for a capacitance is broken through a specific polysilicon electrode portion in a state that a voltage difference is supplied between the substrate and the electrode, leakage current flows, concentrating on a broken electrode portion. In this case, a wiring line for connection between the electrode sections is narrow, and therefore the wiring line connected to the broken electrode section is fused and disconnected by an extraordinary leakage current due to the insulation breakdown to separate the broken polysilicon electrode section from the device.

In this technique, a fuse function for removing the defective device is covered by the wiring line. However, in the recent miniaturized process, to stably fabricate a narrow wiring line as a process node serving as the fuse is difficult in terms of a fabrication method. At a miniaturized process node, influence of a variation on a wiring line width is large, and therefore it is difficult to equalize a current value at which the fuse disconnects the connection to an arbitrary value.

Also, JP2003-338553A (Patent Literature 2) discloses a technique related to a semiconductor device provided with a nonvolatile memory that interrupts a leakage current to a broken electrostatic protective component.

CITATION LIST

[Patent Literature 1]: JP-A-Heisei 2-76251
[Patent Literature 2]: JP 2003-338553A

SUMMARY OF THE INVENTION

The present invention provides a semiconductor device that, can maintain a function as the device to ensure reliability, even if a short-circuit fault occurs inside a capacitance element in the semiconductor device mounted with a large capacitance element.

In an aspect of the present invention, a semiconductor device including a plurality of capacitance units connected in parallel between a first voltage and a second voltage. Each of the plurality of capacitance units includes: a capacitance element connected with the first voltage; and a capacitance disconnecting circuit connected between the second voltage and the capacitance element. The capacitance disconnecting circuit includes a non-volatile memory cell with a threshold voltage changed based on a change of a leakage current which flows from the capacitance element, and blocks off the leakage current based on a rise of the threshold voltage of the non-volatile memory cell when the leakage current exceeds a predetermined value.

In another aspect of the present invention, a charge pump circuit includes a plurality of capacitance units connected in parallel between a first voltage and a second voltage; and a voltage boosting circuit configured to boost a voltage to a predetermined voltage based on a third voltage. Each of the plurality of capacitance units includes: a capacitance element connected with the first voltage; and a capacitance disconnecting circuit connected between the second voltage and the capacitance element. The capacitance disconnecting circuit comprises a non-volatile memory cell with a threshold voltage changed based on a change of a leakage current which flows from the capacitance element, and when the leakage current exceeds a predetermined value, the capacitance disconnecting blocks off the leakage current based on a rise of the threshold voltage of the non-volatile memory cell. The plurality of capacitance units smooth an output voltage of the voltage boosting circuit.

In still another aspect of the present invention, a function maintaining method is provided in a semiconductor device which comprises a plurality of capacitance units connected in parallel between a first voltage and a second voltage. The function maintaining method is achieved: by charging and discharging a plurality of capacitance elements; by detecting whether a leakage current which exceeds a predetermined current through a defective capacitance element of the plurality of capacitance elements has flowed; by disconnecting the defective capacitance element by opening a switch which blocks off the leakage current, when detecting that the leakage current has flowed; and by initializing by closing the switch before the semiconductor device is used.

According to the present invention, the semiconductor device mounted with a large capacitance element can maintain a function as a device to ensure reliability even if the short-circuit fault occurs inside a capacitance element.

BRIEF DESCRIPTION OF THE DRAWINGS

The above and other objects, advantages and features of the present invention will be more apparent from the following description of certain embodiments taken in conjunction with the accompanying drawings, in which:

FIG. 7 is a plan view illustrating a configuration of a capacitance disconnecting circuit according to the second embodiment of the present invention;

DESCRIPTION OF EMBODIMENTS

Hereinafter, a semiconductor device according to the present invention will be described in detail with reference to the attached drawings.

First Embodiment

Figure 1:
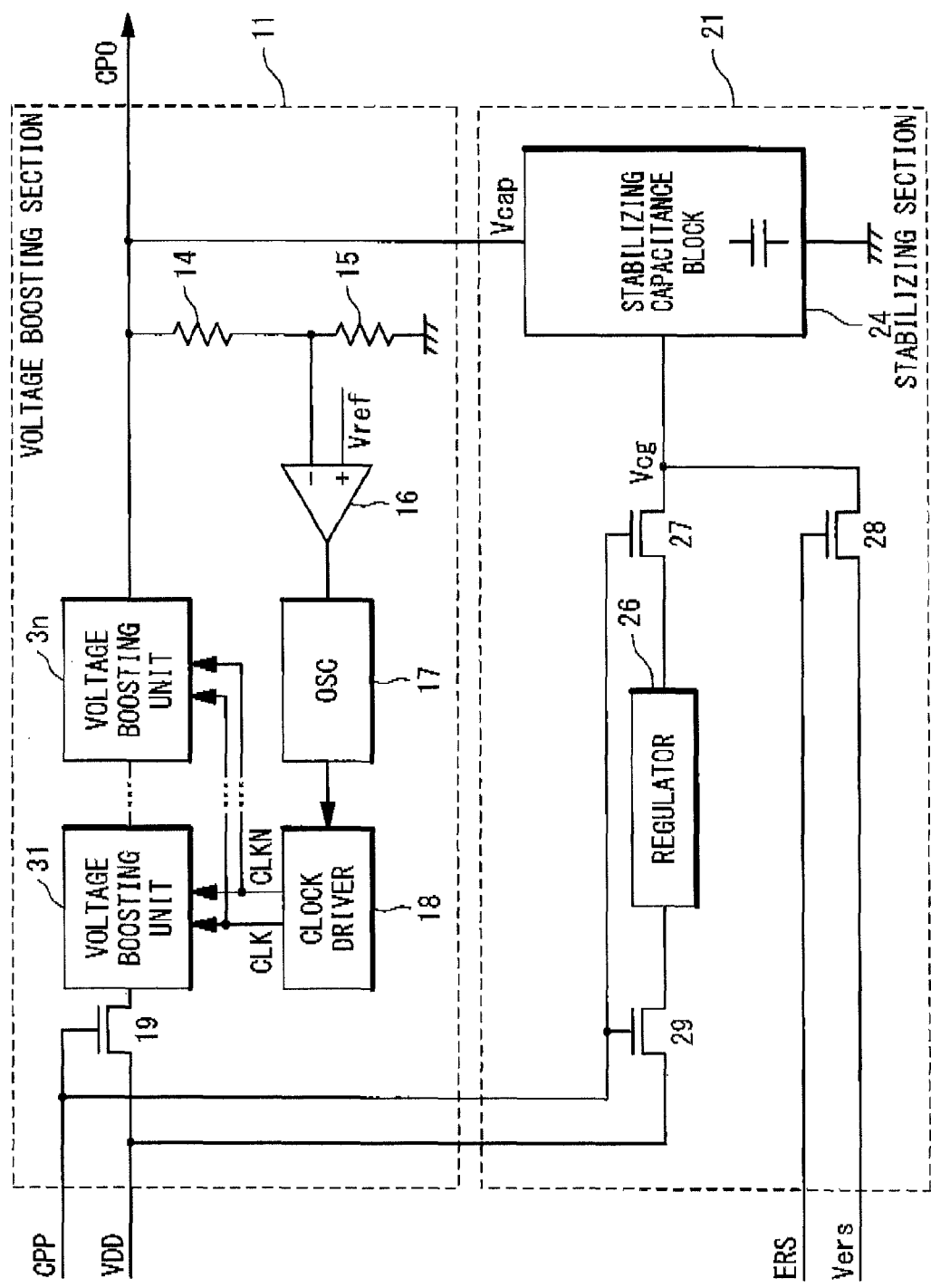
FIG. 1 is a diagram illustrating a configuration of a charge pump circuit according to a first embodiment of the present invention.

With reference to the drawings, the semiconductor device according to a first embodiment of the present invention will be described. As the semiconductor device mounted with a large scale capacitance element, a semiconductor device having a charge pump circuit is known as an example. FIG. 1 illustrates a configuration of the charge pump circuit provided in the semiconductor device. The charge pump circuit is provided with a voltage boosting section 11 that boosts a power supply voltage to a desired voltage, and a stabilizing section 21 that stabilizes the boosted voltage.

Figure 2:
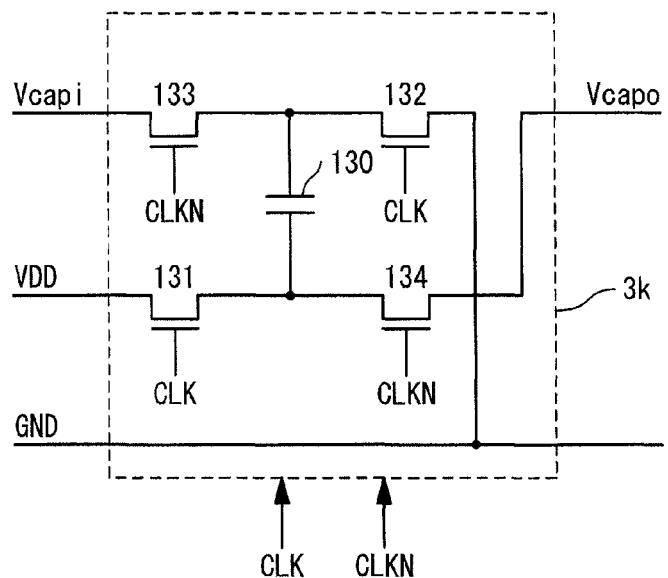
FIG. 2 is a diagram illustrating a configuration of a voltage boosting capacitance unit.

As the voltage boosting section 11, various configurations are known. In this example, the voltage boosting section 11 is provided with voltage boosting capacitance units 31 to 3n, resistance elements 14 and 15, a comparator 16, an oscillator (OSC) 17, a clock driver 18, and a transistor 19. Regarding the voltage boosting capacitance units 31 to 3n, voltage boosting capacitance units 3k as illustrated in FIG. 2 are cascade-connected for n stages.

The voltage boosting capacitance unit 3k is provided with a capacitance element 130, and transistors 131 to 134 each driven in response to a clock signal CLK or a clock signal CLKN obtained by inverting the clock signal CLK. The clock signal CLK is connected to gates of the transistors 131 and 132. The clock signal CLKN is connected to gates of the transistors 133 and 134. The transistors 131 and 134 are connected in series between the power supply voltage VDD and an output voltage Vcapo corresponding to a boost voltage for one stage. The transistors 133 and 132 are connected in series between an input voltage Vcapi outputted from the voltage boosting capacitance unit at a previous voltage and a ground voltage GND. The capacitance element 130 is connected between a connection node between the transistors 131 and 134 and a connection node between the transistors 133 and 132.

When the transistors 131 and 132 are set to an ON state in response to the clock signal CLK, and the transistors 133 and 134 are set to an OFF state in response to the clock signal CLKN, a path of the power supply voltage VDD—the transistor 131—the capacitance element 130—the transistor 132—the ground voltage GND is formed. In this case, the capacitance element 130 is charged to have a voltage VDD. When the transistors 131 and 132 are set to the OFF state in response to the clock signal CLK, and the transistors 133 and 134 are set to the ON state in response to the clock signal CLKN, a path of the input voltage Vcapi—the transistor 133—the capacitance element 130—the transistor 134—the output voltage Vcapo is formed. Accordingly, the voltage boosting capacitance unit 3k outputs a voltage of the input voltage Vcapi added with the voltage VDD of the capacitance element 130 as the output voltage Vcapo.

Here, it is assumed that insulation breakdown occurs in the capacitance element 130 inside the voltage boosting capacitance unit 31 to 3n. When the transistors 131 and 132 are set to the ON state in response to the clock signal CLK, the capacitance element 130 is connected between the power supply voltage VDD and the ground voltage GND and charged. At this time, there is a possibility that a leakage current flows through the capacitance element 130. However, the input voltage Vcapi outputted from the voltage boosting capacitance unit 3k at the previous stage, and the output voltage Vcapo outputted to a voltage boosting capacitance unit 3k at a subsequent stage are blocked of by the transistors 133 and 13. Therefore, there is no influence of the leakage current. When the transistors 133 and 134 are set to the ON state in response to the clock signal CLKN, because the capacitance element 130 is in the conductive state, the voltages Vcapi and Vcapo become a same voltage, and therefore there is no expected boost. However, a path from the power supply voltage VDD to the ground voltage GND is blocked off by the transistors 131 and 132. Therefore, although there is a decrease in the boosted voltage, a fatal failure does not appear with respect to device operation.

As described, the voltage boosting capacitance unit 3k adds the charge voltage of the capacitance element 130 to the input voltage Vcapi to supply the output voltage. The voltage boosting section 11 generates a desired voltage by series—connecting the voltage boosting capacitance units 3k as required. It should be noted that, in the present embodiment, the input voltage Vcapi of the voltage boosting capacitance unit 31 at the first stage corresponds to the power supply voltage VDD. Also, the output voltage Vcapo of the voltage boosting capacitance unit 3n at a final stage is intermittently outputted. Therefore, a large capacitance stabilizing capacitance element for smoothing the intermittent output is required. The stabilizing capacitance element is required to have high breakdown voltage because the voltage to be smoothed is high, and has a large area to achieve the large capacitance. The stabilizing capacitance element is realized by the stabilizing section 21. The output voltage Vcapo of the voltage boosting capacitance unit 3n in the voltage boosting section 11 is smoothed by the stabilizing section 21 to produce an output voltage CPO of the charge pump circuit.

The output voltage CPO of the charge pump circuit is divided by the resistance elements 14 and 15, and then the division voltage is supplied to the comparator 16. The comparator 16 compares the division voltage with a reference voltage Vref to output a result of the comparison to the oscillator 17. If the division voltage exceeds the reference voltage Vref, the oscillator 17 stops oscillation, whereas if the division voltage falls below the reference voltage Vref, the oscillator 17 starts oscillation. The clock driver 18 generates the clock signals CLK and CLKN on the basis of the output of the oscillator 17, to supply them to the voltage boosting capacitance units 31 to 3n. Accordingly, if the output voltage CPO becomes lower than a predetermined voltage, the clock signals CLK/CLKN are supplied to operate the voltage boosting capacitance units 31 to 3n, and thereby the output voltage CPO increases. If the output voltage CPO exceeds the predetermined voltage, the clock signals CLK/CLKN stop, and thereby the output voltage CPO gradually decreases due to discharging. In this manner, the voltage boosting section 11 operates to keep the output voltage CPO constant. It should be noted that the transistor 19 functions as a switch operating in response to a signal CPP to control an operation of the voltage boosting section 11. The voltage boosting section 11 performs the voltage boosting operation when the transistor 19 is in an ON state, and stops the operation when the transistor 19 is in an OFF state.

Figure 3:
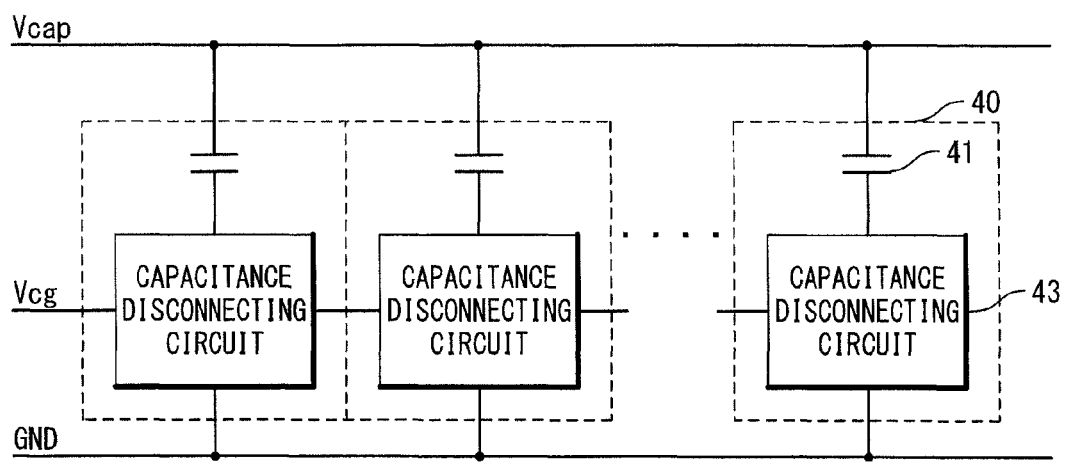
FIG. 3 is a diagram illustrating a configuration of a stabilizing capacitance block.

The stabilizing section 21 is provided with a stabilizing capacitance block 24, a regulator 26, and transistors 27 and 28. As illustrated in FIG. 3, the stabilizing capacitance block 24 is configured such that a plurality of capacitance units 40 are connected in parallel between a voltage Vcap and the ground voltage GND. The capacitance unit 40 includes a capacitance element 41 and a capacitance disconnecting circuit 43 that are connected in series. The capacitance units 40 connected in parallel operate like one capacitance element. Even if the capacitance element 41 included in one capacitance unit 40 among the plurality of capacitance units 40 produces a short-circuit between the voltage Vcap and the ground voltage GND through insulation breakdown, the capacitance disconnecting circuit 43 blocks off the defective capacitance element 41 from the ground voltage GND, and thereby a function of the stabilizing capacitance block 24 is maintained.

Figure 4:
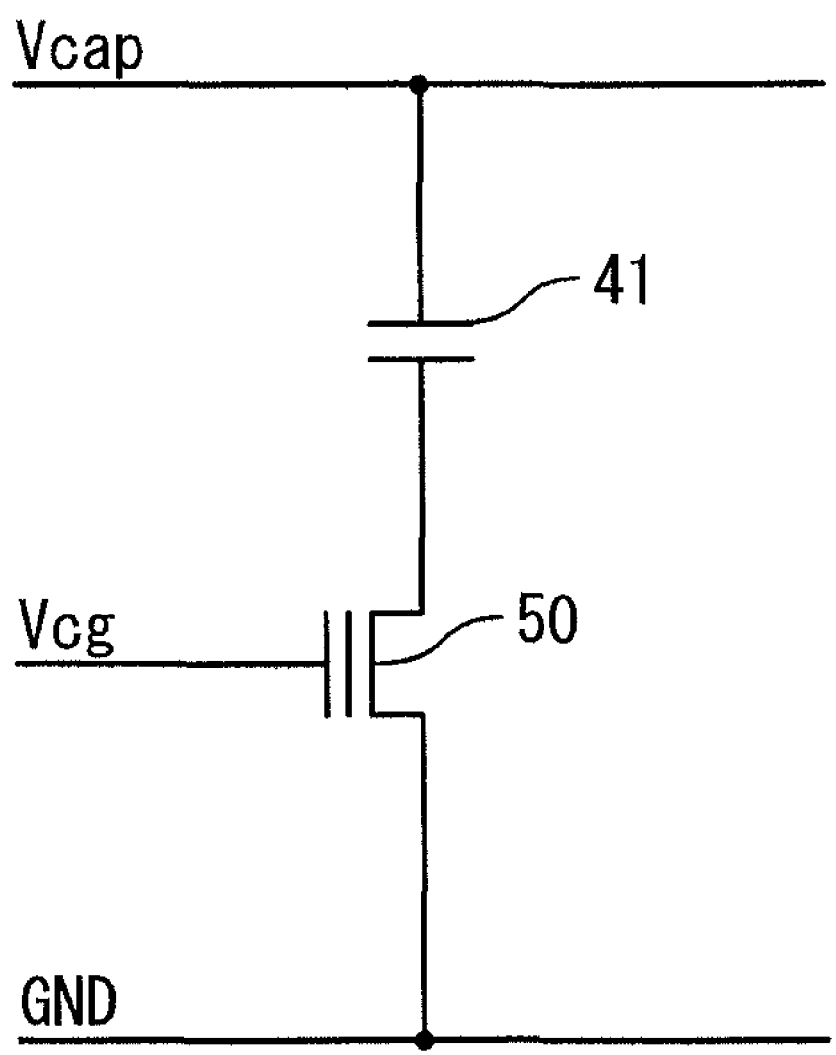
FIG. 4 is a circuit diagram illustrating a configuration of a capacitance unit according to the first embodiment of the present invention.

As illustrated in FIG. 4, the capacitance disconnecting circuit 43 is provided with a flash memory cell 50. The flash memory cell 50 is a CHE (Channel Hot Electron) writable flash memory cell, and used as a fuse for the capacitance element 41. Accordingly, upon an operation, a control gate of the flash memory cell 50 is applied with a voltage Vcg. The flash memory cell 50 can be manufactured in the same processing steps as those of a flash memory cell to which the charge pump circuit supplies the output, or in a few additional processing steps. The flash memory cell 50 is manufactured by appropriately adjusting a source/drain/well profile, a gate length, and a diffusion layer width so as to suitably perform the operation.

The regulator 26 supplies the voltage Vcg that drives the capacitance disconnecting circuit 43. The transistors 29 and 27 function as switches that controls the stabilizing capacitance block 24 in response to the signal CPP. The transistor 29 supplies the voltage VDD to the regulator 26 in the ON state. The regulator 26 generates the voltage Vcg from the voltage VDD to supply it to the stabilizing capacitance block 24 through the transistor 27. The transistor 28 functions as a switch for applying an initializing (erasing) voltage Vers to the capacitance disconnecting circuit 43 as the voltage Vcg when the stabilizing capacitance block 24 is initialized. In the case of directly temporarily applying the voltage Vers from outside, the transistor 28 may be omitted. When the regulator 26 is not supplied with the voltage VDD, the transistor 27 prevents the regulator 26 from being applied with the erasing voltage Vers.

When the stabilizing capacitance block 24 is actually used, the capacitance unit 40 is initialized. Immediately after manufacturing, what kind of state the flash memory cell 50 in the capacitance unit 40 is in is indefinite, and therefore an erasing process of the flash memory cell 50 is performed as initialization. The erasing process causes a threshold voltage Vt to decrease to bring the flash memory cell 50 into a low resistance state. The initialization may be performed by externally supplying a required voltage upon a well test or chip selection.

When the erasing process is performed, the signal CPP exhibits inactivation, and the transistor 19 in the voltage boosting section 11 and the transistors 27 and 29 in the stabilizing section 21 are set to an OFF state. The voltage boosting section 11 does not operate, and the voltage Vcap is 0. A signal ERS instructing an erasing operation, and the erasing voltage Vers are externally supplied. When the signal ERS is activated, the voltage Vers is supplied to the stabilizing capacitance block 24, instead of the voltage outputted from the regulator 26. It should be noted that the erasing voltage Vers may be directly supplied to the stabilizing capacitance block 24 without providing the transistor 28.

A node of the flash memory cell 50 on the side of the voltage boosting section 11 is in an open state because the voltage boosting section 11 does not operate (hereinafter, to be referred to as a drain side node), and a node on the opposite side is connected to the ground voltage GND (hereinafter, to be referred to as a source side node). Under this state, when the erasing voltage Vers (e.g., a negative voltage of approximately −20 volts) is applied to the control gate as the control gate voltage Vcg, electrons present in a floating gate are extracted to a source side node by FN tunneling. In this manner, the flash memory cell 50 is initialized (erased).

Upon the operation of the stabilizing section 21, the control gate of the flash memory cell 50 is applied with the voltage Vcg. In this state, when a large current flows between the source and the drain, hot electrons are generated, and drew into the floating gate by a gate electric field (CHE writing). When the electrons sufficiently enter the floating gate, the voltage of the floating gate decreases, and the threshold voltage Vt of the flash memory cell 50 increases. However, during an ordinary operation, a value of a leakage current flowing through the capacitance element 41 is sufficiently small, and therefore the threshold voltage Vt of the flash memory cell 50 hardly varies. A channel portion of the flash memory cell 50 keeps low resistance, and the stabilizing section 21 operates as an ordinary capacitance element.

Here, it is assumed that insulation (e.g., a gate oxide film in an MOS process) of the capacitance element 41 during the operation is broken for some reason. In this case, a large current (abnormal leakage current) flows between the source and drain of the flash memory cell 50 connected in series to the broken capacitance element 41. When the appropriate control gate voltage (Vcg) is provided, the CHE writing due to the extraordinary leakage current occurs. The CHE writing causes the threshold voltage Vt of the flash memory cell 50 to increase to set the channel section of the memory cell to a high resistance state. If a well profile having appropriate source-drain breakdown voltage to the voltage applied to the capacitance element 41 is formed in the flash memory cell 50, the extraordinary leakage current can be autonomously stopped by the CHE writing without any external detection circuit.

Then, the capacitance element 41 having been subjected to the insulation breakdown is semipermanently separated from the stabilizing capacitance block 24. Entire operation of the stabilizing section 21 can be continued by a plurality of remaining ordinary capacitance elements 41.

As described, by using a flash memory cell as a fuse for the insulation breakdown of the capacitance element, a semiconductor device can be provided to include defect resistant and highly reliable capacitance element by micro-fabrication comparable with a typical process.

Second Embodiment

Figure 5:
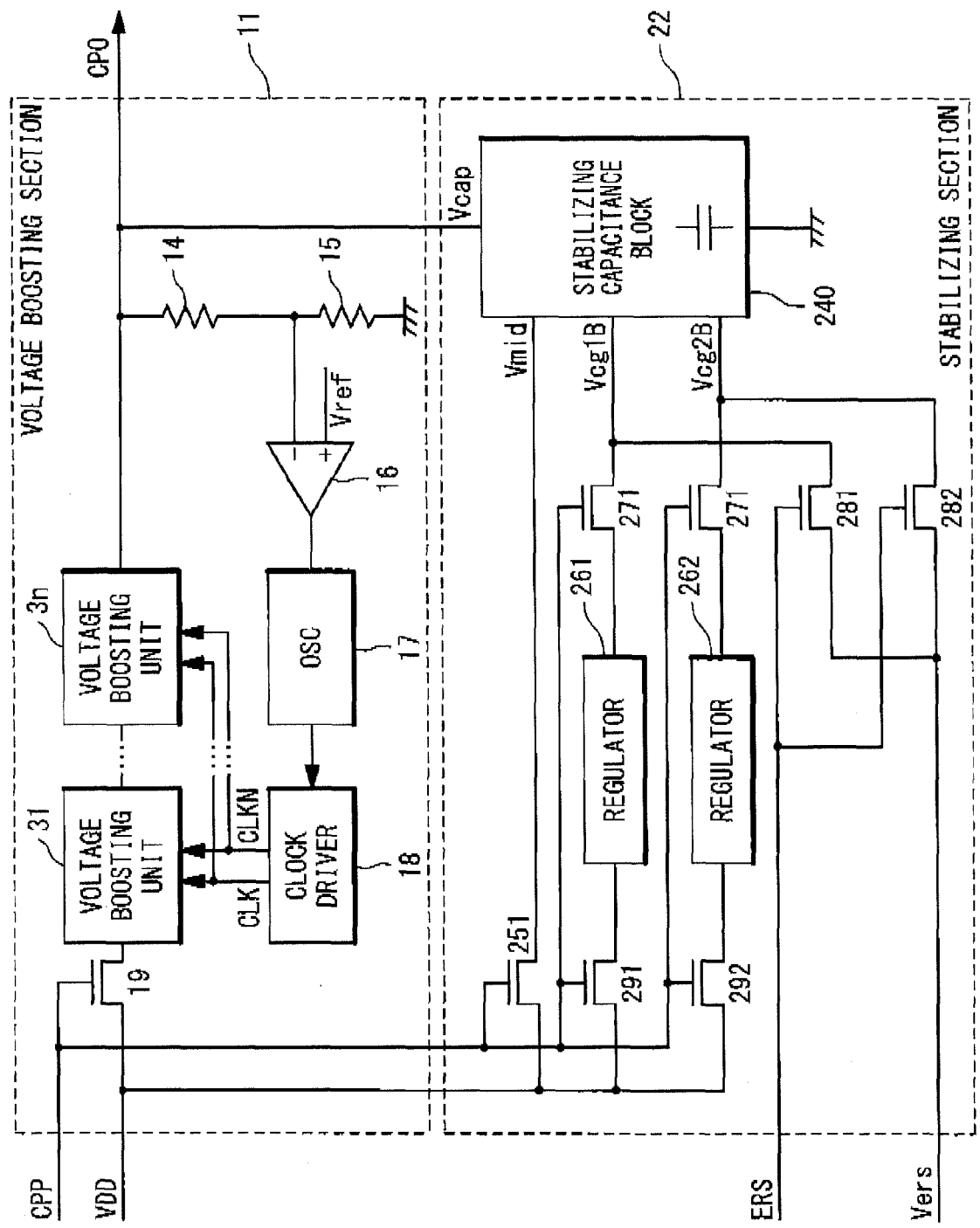
FIG. 5 is a diagram illustrating a configuration of a charge pump circuit according to a second embodiment of the present invention.

Referring to FIG. 5, the semiconductor device according to a second embodiment of the present invention will be described. As illustrated in FIG. 5, the charge pump circuit incorporated in the semiconductor device is provided with the voltage boosting section 11 and the stabilizing section 22. The voltage boosting section 11 is the same as the voltage boosting section 11 described in the first embodiment, and therefore description thereof is omitted.

The stabilizing section 22 is provided with a stabilizing capacitance block 240, regulators 261 and 262, transistors 251, 271, 272, 281, 282, 291, and 292. The stabilizing capacitance block 240 is applied with the voltages Vmid, Vcg1, and Vcg2 to smooth the voltage Vcap outputted from the voltage boosting capacitance unit $3n$ in the voltage boosting section 11. Details of the stabilizing capacitance block 240 will be described later.

The transistor 251 is a switch that supplies the voltage Vmid to the stabilizing capacitance block 240 in an ordinary operation. In the present embodiment, the power supply voltage VDD is supplied as the voltage Vmid. The transistors 291 and 292 are switches that respectively supply the power supply voltage VDD to the regulators 261 and 262 in response to the signal CPP in the ordinary operation. The regulators 261 and 262 generate the voltages Vcg1 and Vcg2 from the power supply voltage VDD to supply them to the stabilizing capacitance block 240. The transistors 281 and 282 are switches that respectively supply the voltage Vers to the stabilizing capacitance block 240 as the voltages Vcg1 and Vcg2 in response to an erasing signal ERS in an erasing operation. The transistors 271 and 272 prevent backflow in the erasing operation to protect the regulators 261 and 262.

As illustrated in FIG. 3, the stabilizing capacitance block 240 is configured such that the plurality of capacitance units 40 are connected in parallel between the voltage Vcap and the ground voltage GND. In each of the capacitance units 40, the capacitance element 41 and the capacitance disconnecting circuit 43 are connected in series. The plurality of capacitance units 40 operate like one capacitance element. The capacitance disconnecting circuit 43 in the present embodiment includes flash memory cells 51 and 52 that share a floating gate, unlike the capacitance disconnecting circuit 43 described in the first embodiment. Therefore, the voltages Vcg1, Vcg2, and Vmid are supplied.

Figure 6:
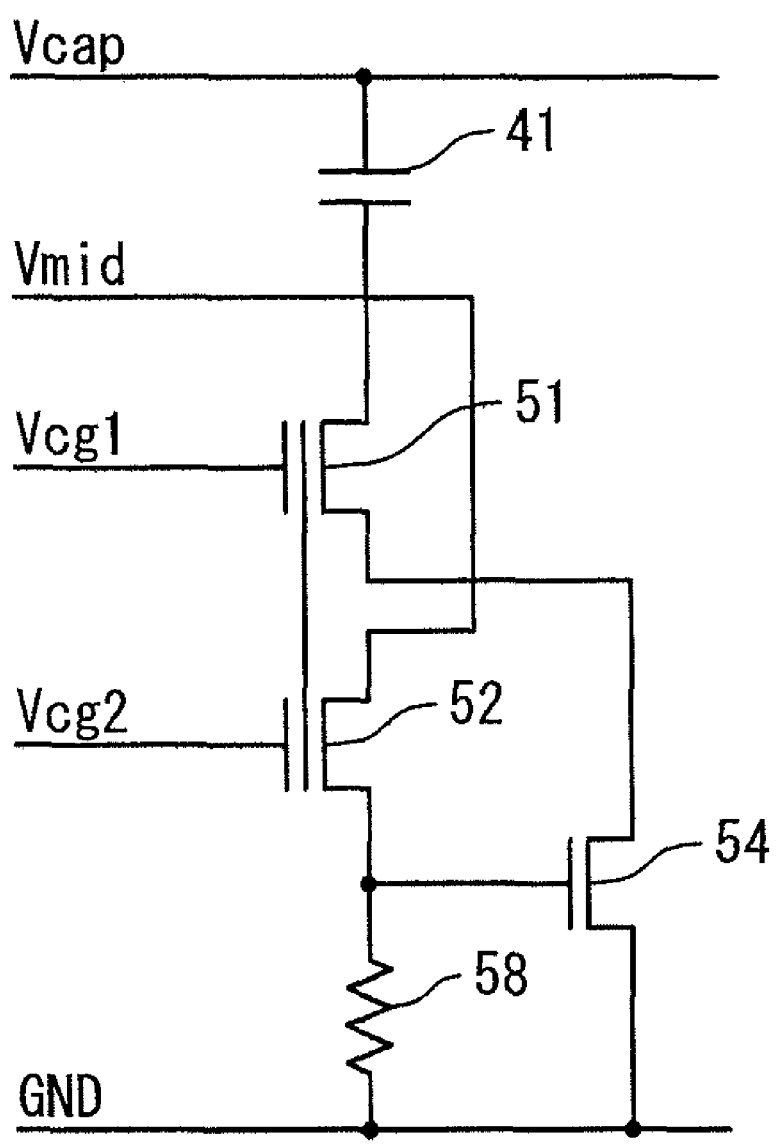
FIG. 6 is a circuit diagram illustrating a configuration of the capacitance unit according to the second embodiment of the present invention.

As illustrated in FIG. 6, each of the capacitance units includes the capacitance element 41, the flash memory cells 51 and 52 sharing the floating gate, an MOS transistor 54, and a resistance element 58. The capacitance element 41—flash memory cell 51—MOS transistor 54 are connected in series between the voltage Vcap and the ground voltage GND, and the flash memory cell 52—resistance element 58 are connected in series between the voltage Vmid and the ground voltage GND. A connection node between the flash memory cell 52 and the resistance element 58 is connected to a gate of the MOS transistor 54 to provide a bias voltage for the MOS transistor 54. The MOS transistor 54 has a source-drain breakdown voltage equal to or more than the voltage applied to the capacitance element 41. The voltages Vcg1, Vcg2, and Vmid are applied to a control gate of the flash memory cell 51, a control gate of the flash memory cell 52, and a drain of the flash memory cell 52, respectively.

FIG. 7 is a plan view illustrating a cell configuration example of the capacitance disconnecting circuit 43. The resistance element 58 (polysilicon gate resistance $2d$) is arranged on a right side of FIG. 7, the MOS transistor 54 is arranged in the center of FIG. 7. The flash memory cell 51 is arranged on a lower left side of FIG. 7, and the flash memory cell 52 is arranged on an upper left side of FIG. 7. In the left center of FIG. 7, a polysilicon gate $2d$ serving as the shared floating gate is arranged.

Figure 8A:
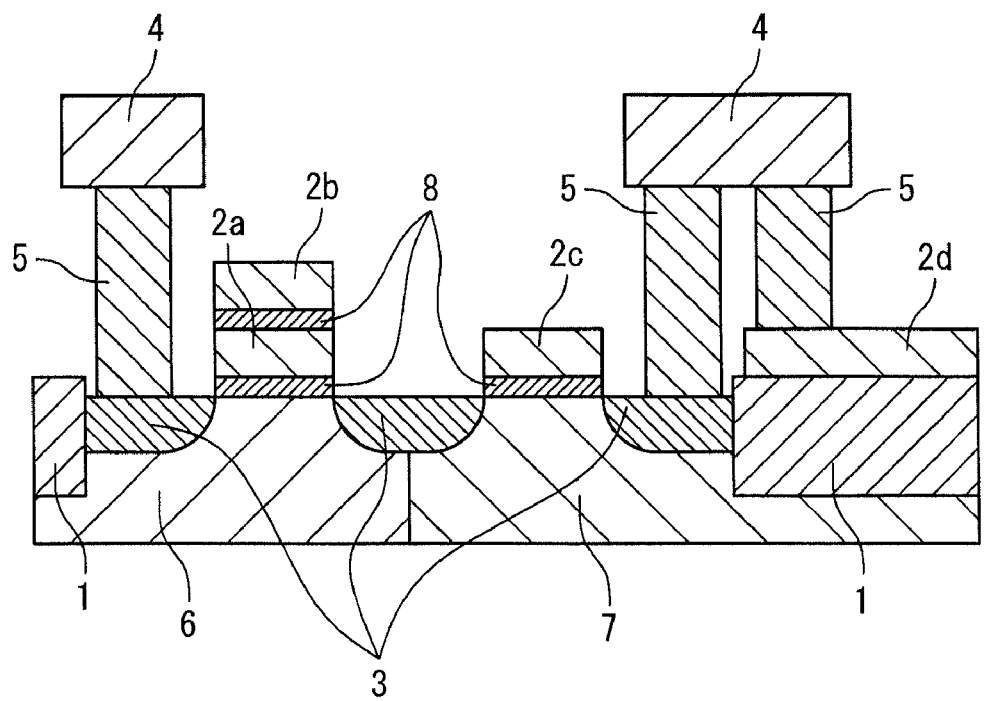
FIG. 8A is a cross-sectional view illustrating the configuration of the capacitance disconnecting circuit according to the second embodiment of the present invention.

A cross section A from the flash memory cell 51 to the MOS transistor 54 further to the resistance element 58 is illustrated in FIG. 8A. In the flash memory cell 51, a gate insulating film 8, a polysilicon layer 2 serving as the floating gate $2a$, a gate insulating film 8, and a polysilicon layer 2 serving as the control gate $2b$ are layered on a well 6 of a flash memory. Diffusion layers 3 are formed in the well 6 on both sides of the layers. One of the diffusion layers 3 is connected to the capacitance element 41 by a first metal wiring line 4 through a contact 5. The other diffusion layer 3 is connected to a diffusion layer 3 of the MOS transistor 54. In the MOS transistor 54, the gate insulating film 8 and a polysilicon layer 2 serving as the gate $2c$ of the MOS transistor are layered on a well 7 of a logic transistor. Diffusion layers 3 are formed in the well 7 on both sides of the laminated layers. The diffusion layer 3 on a side opposite to the diffusion layer 3 connected to the flash memory cell 54 is connected to the first metal wiring line 4 through a contact 5, and further connected to the polysilicon gate resistance $2d$ serving as the resistance element 58 through the contact 5.

Figure 8B:
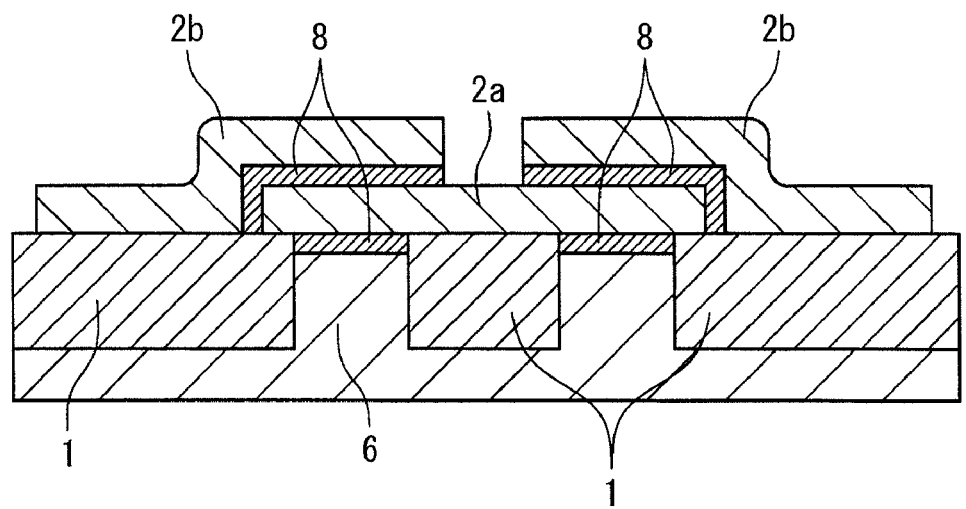
FIG. 8B is a cross-sectional view illustrating the configuration of the capacitance disconnecting circuit according to the second embodiment of the present invention.

FIG. 8B illustrates a cross section B including the shared floating gate of the flash memory cells 51 and 52. The flash memory cells 51 and 52 are configured such that, the gate insulating film 8, the polysilicon layer 2 serving as the shared floating gate $2a$, the gate insulating film 8, and the polysilicon layer 2 serving as the control gate $2b$ are layered on the well 6 of the flash memory. They are isolated from the other elements by element isolation layers 1. As illustrated in the center of FIG. 8B, the control gate $2b$ is isolated between the flash memories 51 and 52. However, if the both can be controlled with the same voltage, the isolation is not necessary, which simplifies a manufacturing process.

In the ordinary operation, the shared floating gate of the flash memory cells 51 and 52 is in the erased state. If the control gates are applied with the appropriate voltages Vcg1 and Vcg2, the flash memory cells 51 and 52 are set to a low resistance state. The flash memory cell 52 supplied with the voltage Vmid flows current, and a voltage drop by the resistance element 58 sets the MOS transistor 54 to an ON state. Accordingly, the capacitance unit 40, and the stabilizing capacitance block 240 that is an assembly of the capacitance units 40 operate as normal capacitance elements, respectively.

Since the flash memory cell 51 is set to the low resistance state if insulation of the capacitance element 41 is broken, large current flows between a drain and source of the flash memory cell 51, and in the flash memory cell 51, CHE writing occurs. When charges are accumulated in the floating gate, a threshold voltage Vt of the flash memory cell 52 also increases to be set to the high resistance state because the floating gate is shared. Thus, the voltage drop by the resistance element 58, which provides the bias to the MOS transistor 54, to decrease to set the MOS transistor 54 to the OFF state. Accordingly, the defective capacitance element 41 is separated from the stabilizing capacitance block 240.

As described, the capacitance unit 40 of the present embodiment is provided with the flash memory cell 51 that autonomously senses insulation failure of the capacitance element 41, and the MOS transistor 54 that blocks off the leakage current. For this reason, even when the drain-source breakdown voltage of the flash memory cell 51 is insufficient relative to the voltage applied to the capacitance element 41, a disconnecting operation for the defective capacitance element 41 can be performed. The flash memory cell 51 and the high breakdown voltage MOS transistor 54 are arranged in series, and thereby even in the charge pump circuit performing the ordinary operation with a high voltage (e.g., 13 V) exceeding an input/output level of the semiconductor device, a defective element can be autonomously disconnected without an external detection circuit, and an extraordinary leakage current can be surely blocked off. The stabilizing capacitance block 240 in which the defective element is disconnected can continue to operate with the other normal capacitance elements 41.

In the above, the flash memory cells 51 and 52 sharing the floating gate are described in which the respective control gates are supplied with the different voltages. They can be configured such that, by adjusting a source/drain/well profile, a gate length, and a diffusion layer width, the same voltage can be applied. In such a case, the control gates can be coupled to each other, which is more preferable for a process for manufacturing the present semiconductor device.

As described, by using a flash memory cell as a fuse for the insulation breakdown of a capacitance element, a defective element can be stably disconnected without requiring microfabrication having a high degree of difficulty. The flash memory cell having disconnected the defective capacitance element can semi-permanently retain an OFF state unless the erasing operation is performed. Such a fuse can be used to provide a semiconductor device including a defect resistant and highly reliable capacitance element. In particular, in the cases of a flash memory and a semiconductor device including the flash memory, such a large capacitance element used as a module such as a charge pump circuit is formed simultaneously with manufacturing a flash memory cell used as a memory element.

Here, initialization (erasing operation) of the stabilizing capacitance block 240 will be described. When a manufacturing process is completed, a state of a flash memory cell is indeterminate, and therefore required to be set to an erased state (state where a threshold voltage Vt is low) before the operation of the semiconductor device. In order to initialize the flash memory cell, a high voltage should be applied to the flash memory cell. However, the output voltage of the charge pump circuit described above cannot be used until the initialization of the stabilizing capacitance block 240 is completed. Accordingly, a voltage necessary for the initialization is supplied from outside the semiconductor device.

The initialization is preferably performed upon a well test or chip selection. Upon the initialization, the signal CPP exhibits an inactive state, and the transistor 19 in the voltage boosting section 11, and transistors 251, 271, 272, 291, and 292 in the stabilizing section 22 are set to the OFF state. The voltage boosting section 11 does not operate, and the voltage Vcap is 0. The signal ERS instructing the erasing operation, and the erasing voltage Vers are externally supplied. When the signal ERS is activated, the voltage Vers is supplied to the stabilizing capacitance block 240 instead of the voltages outputted from the regulators 261 and 262. It should be noted that, without providing the transistor 281 or 282, the erasing voltage Vers may be directly supplied to the stabilizing capacitance block 240.

As can be seen from FIG. 6, a node of the flash memory cell 51 on the side of the voltage boosting section 11 is in an open state (hereinafter, to be referred to as a drain side node), but a node on the opposite side is connected to the MOS transistor (hereinafter, to be referred to as a source side node). The operation of the MOS transistor 54 is controlled by the flash memory cell 52, and the state of the flash memory cell 52 is indeterminate, and therefore a state of the source side node is also indeterminate. Accordingly, the initialization should be performed by a method different from the initialization of the capacitance unit described in the first embodiment. Here, the following two methods are presented.

Figure 9:
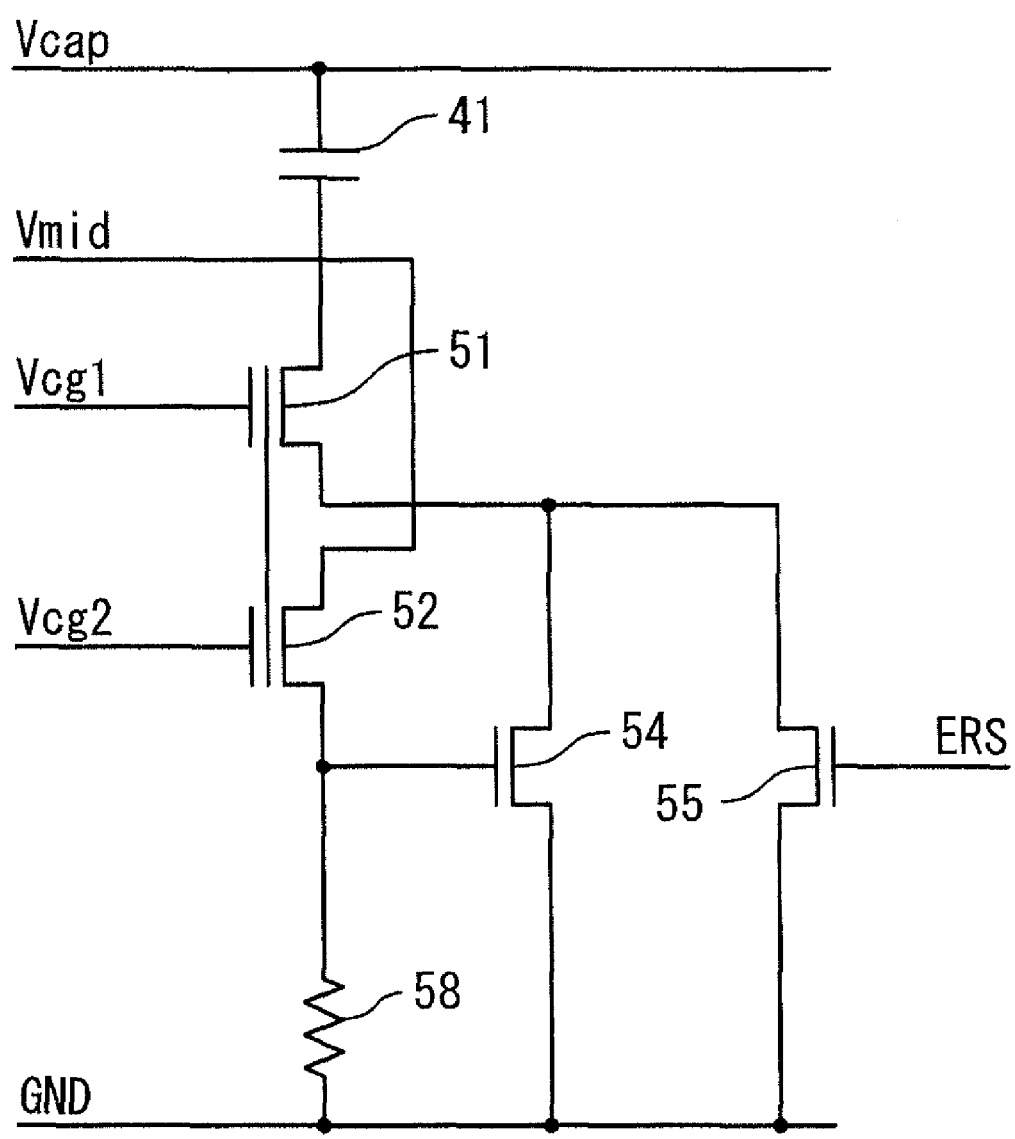
FIG. 9 is a circuit diagram illustrating a modification of the configuration of the capacitance unit according the second embodiment of the present invention.

As illustrated in FIG. 9, a transistor 55 controlled by the signal ERS is provided between the drain side node of the flash memory cell 51 and the ground voltage GND. The transistor 55 connects the drain side node of the flash memory cell 41 and the ground voltage GND while the signal ERS is activated. Upon the initializing operation, since the signal CPP is in the inactive state, the voltage Vmid is not supplied and the drain side node of the flash memory cell 52 is set to an open state. Further, the signal ERS is activated, and the voltage Vers (negative voltage of approximately −20V) is applied to the control gates of the flash memory cells 51 and 52 through the transistors 281 and 282. As a result, electrons in the floating gate are drawn out to the source side node through FN tunneling. In this manner, the initialization (erasing) of the flash memory cells 51 and 52 is performed.

Figure 10:
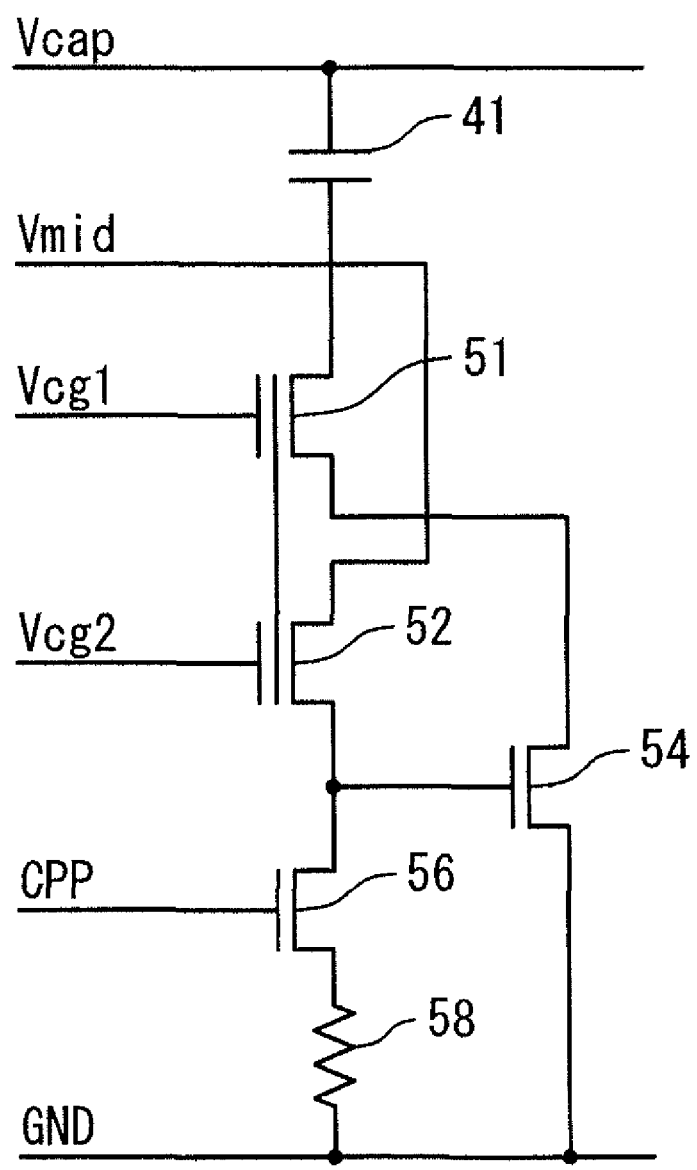
FIG. 10 is a circuit diagram illustrating a modification of the configuration of the capacitance unit according the second embodiment of the present invention.

Also, as in the normal operation, the initialization can also be performed on a flash memory cell 52 in a state that the flash memory cell 52 is applied with the voltage Vmid. In this case, the flash memory cell 52 is applied with the voltage Vmid, and therefore the transistor 251 can be made unnecessary. That is, upon the erasing operation, the erasing voltage Vers (negative voltage of approximately −7V) is applied to the control gate as the voltage Vcg2, in the state that the flash memory cell 52 is applied with the voltage Vmid (voltage of approximately 5V). A voltage difference between the voltages Vmid and Vers is sufficiently large, and therefore the electrons in the floating gate are extracted or drawn out through the FN tunneling by use of the node on the side of voltage Vmid as a source. In this manner, the initialization (erasing operation) of the flash memory cells 51 and 52 can also be performed. In this case, there may be required countermeasures against heat generation due to a source-drain current of the flash memory cell 52, and disturbing write. In such a case, as illustrated in FIG. 10, it is only necessary to insert a transistor 56 between the flash memory cell 52 and the resistance element 58. The transistor 56 is set to an ON state in response to the signal CPP, and therefore, upon the erasing operation, is set to an OFF state to open a connection node with the flash memory cell 52.

As described above, the stabilizing capacitance blocks 24 and 240 are initialized. However, an initializing method is not limited to any of the above methods. For example, it may be configured such that positive and negative of the voltages are replaced by each other to extract the electrons in the floating gate to a control gate.

Third Embodiment

As described above, when a charge pump circuit operates, a current flows through each of the plurality of capacitance elements 41 inside the stabilizing capacitance block 24 or 240 although it is very small. The current is as extremely small as approximately $10^{-5}$ times as compared with a leakage current upon the insulation breakdown of the capacitance element 41. For this reason, there is no rapid writing operation on the flash memory cell 50 or 51. However, if the semiconductor device is used for a long time, write is performed to some extent. This may increase a parasitic resistance of the stabilizing capacitance block 240 to result in performance degradation.

Figure 11:
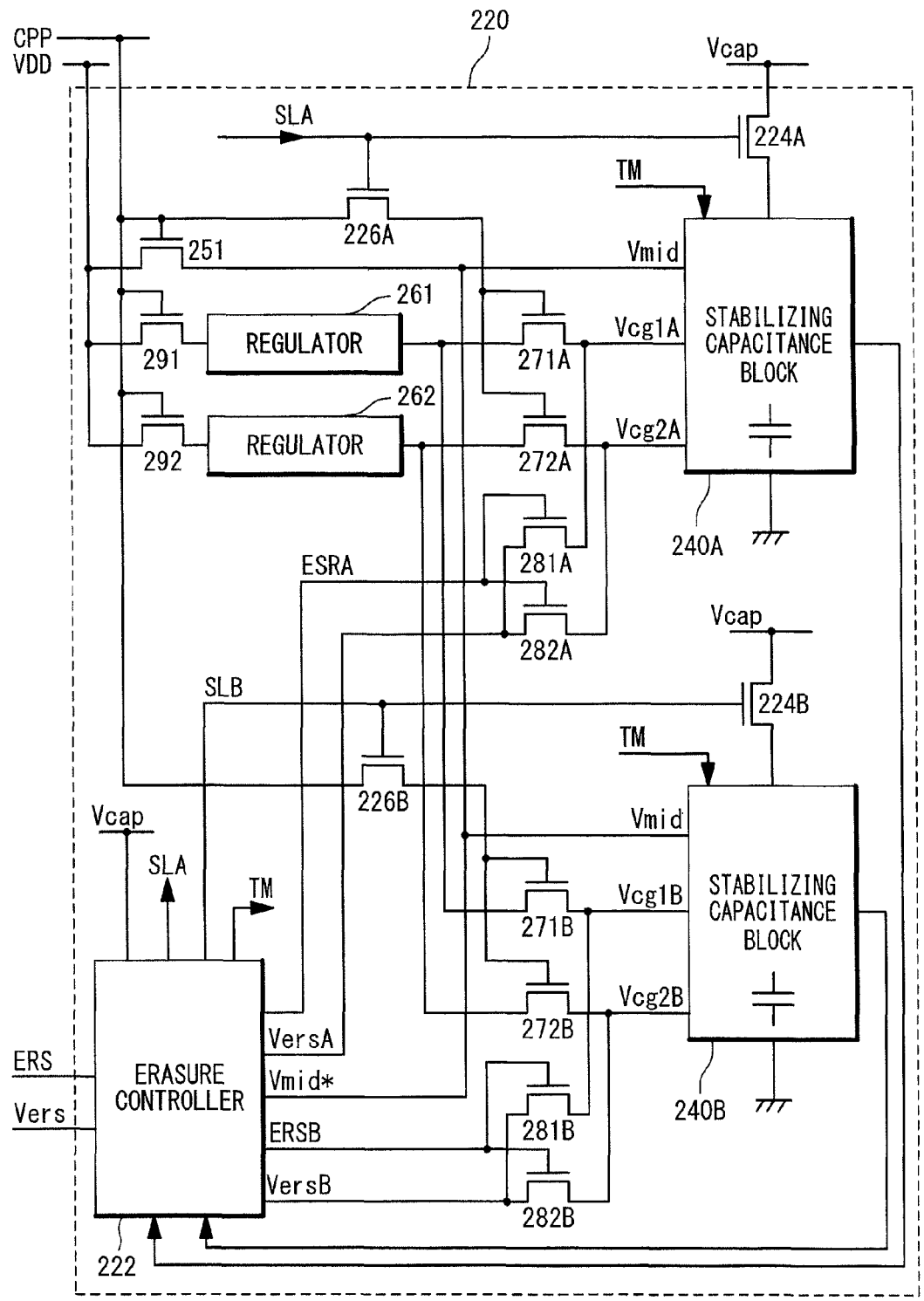
FIG. 11 is a diagram illustrating a configuration of the stabilizing section according to a third embodiment of the present invention.

In a third embodiment, as illustrated in FIG. 11, a stabilizing section 220 provided with a refresh function as a countermeasure against this will be described. In the stabilizing section 220, the stabilizing section 22 described in the second embodiment is divided such that respective divisions can independently perform the stabilizing operation, and a circuit is added such that the erasing operation (recovering operation) can also be performed. Accordingly, in the ordinary operation, the stabilizing section 220 operates exactly in the same manner as the stabilizing section 22. In a refreshing operation, a determination is made between a disconnected flash memory cell to which the write is performed by insulation breakdown of a capacitance with exceeding a predetermined voltage level, and a ordinary flash memory cell to which weak write is performed by an ordinary operation current, and the erasing operation is performed on the ordinary flash memory. The erasing operation is appropriately performed to recover the weak write state of the ordinary flash memory cell to an initial state.

The stabilizing section 220 provided with the refresh function is provided with some stabilizing capacitance blocks 240. As illustrated in FIG. 11, the stabilizing capacitance blocks 240A and 240B are exemplified. The stabilizing section 220 is provided with the stabilizing capacitance blocks 240A and 240B, an erasure controller 222, regulators 261 and 262, and transistors 224A, 224B, 226A, 226B, 251, 271A, 271B, 272A, 272B, 281A, 281B, 282A, 282B, 291, and 292.

The transistor 251 is a switch that supplies the voltage Vmid to the stabilizing capacitance blocks 240A and 240B upon the ordinary operation. In this case, as the voltage Vmid, the power supply voltage VDD is supplied. The transistors 291 and 292 are switches that supply the power supply voltage VDD to the regulators 261 and 262 upon the ordinary operation, in response to the signal CPP, respectively. The regulator 261 generates the voltage Vcg1 from the power supply voltage VDD. The voltage Vcg1 is supplied to the stabilizing capacitance block 240A through the transistor 271A as a voltage Vcg1A, and also supplied to the stabilizing capacitance block 240B through the transistor 271B as a voltage Vcg1B. The regulator 262 generates a voltage Vcg2 from the power supply voltage VDD. The voltage Vcg2 is supplied to the stabilizing capacitance block 240A through the transistor 272A as a voltage Vcg2A, and also supplied to the stabilizing capacitance block 240B through the transistor 272B as a voltage Vcg2B.

The transistors 281A and 282A supply the voltage Vers to the stabilizing capacitance block 240A as the voltages Vcg1A and Vcg2A in response to an erasing signal ERSA upon the erasing operation. The transistors 281B and 282B supply the voltage Vers to the stabilizing capacitance block 240B as the voltages Vcg1B and Vcg2B in response to an erasing signal ERSB upon the erasing operation. The transistor 226A performs ON/OFF control of the transistors 271A and 272A in response to a signal SLA. The transistor 226B performs ON/OFF control of the transistors 271B and 272B in response to a signal SLB. The transistors 271A and 272A are driven by the transistor 226A to supply the voltages Vcg1A and Vcg2A to the stabilizing capacitance block 240A, and prevent backflow upon the erasing operation to protect the regulators 261 and 262. The transistors 271B and 272B are driven by the transistor 226B to supply the voltages Vcg1B and Vcg2B to the stabilizing capacitance block 240B, and prevent backflow upon the erasing operation, to protect the regulators 261 and 262. The transistor 224A connects the stabilizing capacitance block 240A and an output of a voltage boosting section 11 in response to the signal SLA. The transistor 224B connects the stabilizing capacitance block 240B and the output of the voltage boosting section 11 in response to the signal SLB.

Figure 12:
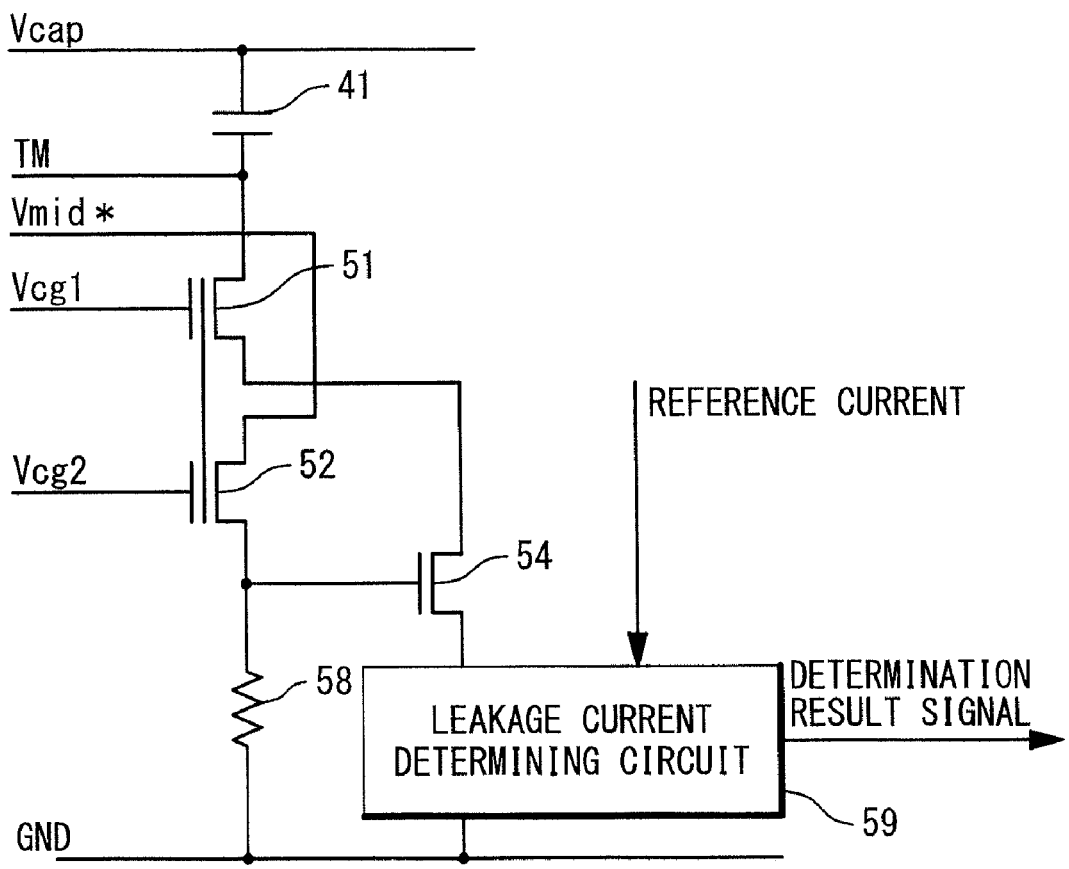
FIG. 12 is a circuit diagram illustrating a configuration of the capacitance unit according to the third embodiment of the present invention.

The erasure controller 222 controls the above respective transistors in accordance with an external instruction or autonomously to refresh flash memory cells included in the stabilizing capacitance blocks 240A and 240B. As illustrated in FIG. 12, a capacitance disconnecting circuit 43 of the present embodiment is configured such that the capacitance disconnecting circuit described in the second embodiment is added to a leakage current determining circuit 59. Accordingly, the capacitance unit 40 of the present embodiment is provided with the capacitance element 41, the flash memory cells 51 and 52 that share a floating gate, the MOS transistor 54 that blocks off the leakage current, the resistance element 58 that provides a bias, and the leakage current determining circuit 59.

The leakage current determining circuit 59 is connected between the MOS transistor 54 and the ground voltage GND, and the leakage current determining circuit 59 compares a leakage current flowing through the MOS transistor 54 with a reference current to determine what level of write is performed to the flash memory cells 51 and 52. In this test mode, the flash memory cell 52 is applied with a test voltage Vmid*, instead of the voltage Vmid upon the ordinary operation. Also, a voltage Vcap applied to the capacitance element 41 upon the ordinary operation is blocked off by the transistor 224A or 224B, and the flash memory cell 51 is applied with a voltage TM for a leakage current test. The leakage current determining circuit 59 determines between a flash memory cell to which a certain level of writing or more is performed to disconnect the capacitance element 41 and a flash memory cell to which weak write is performed in the ordinary operation, and outputs a result of the determination to the erasure controller 222 as a determination result signal.

Figure 14:
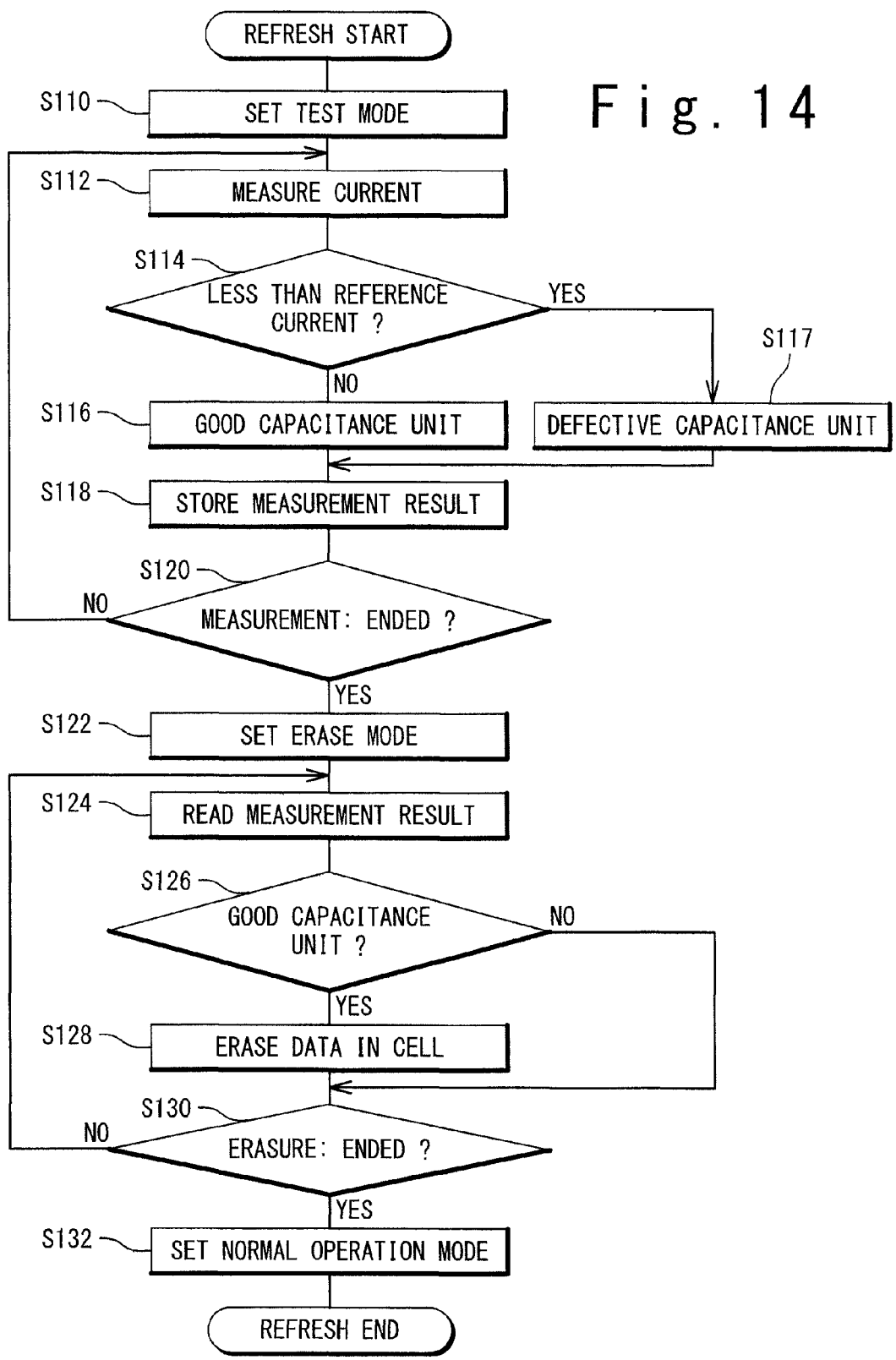
FIG. 14 is a flowchart describing refreshing operation according to the third embodiment of the present invention.

Referring to FIG. 14, the refreshing operation will be described. Preferably, the refreshing operation is appropriately performed when the semiconductor device mounted with the stabilizing capacitance blocks 240A and 240B does not perform the ordinary operation.

First, the stabilizing section 220 is set to the test mode. The signal CPP is inactivated to stop the ordinary operation. The erasure controller 222 inactivates the signals SLA and SLB to stop the supply of the voltages Vcap, Vcg1A/B, and Vcg2A/B to the stabilizing capacitance blocks 240A and 240B. The erasure controller 222 applies the signals TM and Vmid* to the flash memory cells 51 and 52 as voltages for determining a write level. As can be seen from FIG. 12, these voltages are applied to the flash memory cells 51 and 52 without being affected by the capacitance element 41 (Step S110).

A current flowing through the MOS transistor 54 at this time is measured by the leakage current determining circuit 59. The leakage current determining circuit 59 determines whether or not the leakage current is less than the reference current (Step S112). The voltages TM and Vmid* for determining the write level are applied to the flash memory cells 51 and 52 that share the floating gate. For this reason, if the write level for the flash memory cells is low, a drain and a gate of the MOS transistor 54 will be applied with voltages close to the voltages TM and Vmid*. Accordingly, the MOS transistor 54 is set to an ON state, and therefore current flows which is equal to or more than the predetermined reference current. If the flash memory cells 51 and 52 are sufficiently written, the drain and the gate of the MOS transistor 54 are only applied with low voltages, so that the MOS transistor 54 is not set to an ON state, and therefore only a current less than the reference current flows through the leakage current determining circuit 59. Accordingly, when only the current less than the reference current flows, the leakage current determining circuit 59 determines that a corresponding capacitance unit is a defective capacitance unit in which the flash memory cells 51 and 52 have been sufficiently written, and outputs the determination result to the erasure controller 222 as the determination result signal.

If the leakage current is less than the reference current (Step S114—Yes), the corresponding capacitance unit 40 is determined as the defective capacitance unit (having been subjected to insulation breakdown) in which the flash memory cells 51 and 52 have been sufficiently written (Step S117). On the other hand, if the leakage current is more than the reference current (Step S114—No), the corresponding capacitance unit is determined as a good capacitance unit in which only weak write due to the ordinary operation is performed (Step S116). The erasure controller 222 stores a result of the determination in a memory (Step S118). The memory to store it may be provided in the erasure controller 222, or in the semiconductor device outside the erasure controller 222.

The determination of the write level into the capacitance unit 40 is performed on all capacitance units inside the stabilizing capacitance blocks 240A and 240B (Step S120—No). If the determination is completed (Step S120—Yes), the application of the voltages for determining a write level is stopped.

Then, the erasure controller 222 sets an erasing mode. In the erasing mode, the voltage boosting section 11 performs the ordinary operation to generate the voltages necessary to erase the flash memory cells 51 and 52 (Step S122).

The erasure controller 222 reads the result of the write level determination (Step S124) to check whether or not the stabilizing capacitance block 240A includes a defective capacitance unit (Step S126). If the defective capacitance unit is included (Step S126—No), it is not necessary to erase written electrons, and therefore the erasing operation is skipped (Step S130). If the stabilizing capacitance block 240A is a good capacitance unit (Step S126—Yes), write states of the flash memory cells in the stabilizing capacitance block 240A are erased.

At this time, the stabilizing capacitance block 240B (block other than 240A) receives the output of the voltage boosting section 11 to perform the ordinary operation, and initializes the flash memory cells of the stabilizing capacitance block 240A with a stabilized voltage therefrom. That is, the signal CPP is activated, and the voltage boosting section 11 starts an ordinary boosting operation. The erasure controller 222 activates the signal SLB to supply the voltages Vcap, Vmid, Vcg1B, and Vcg2B to the stabilizing capacitance block 240B. The voltages Vcg1B and Vcg2B are voltages upon the ordinary operation, which are generated by the regulators 261 and 262, and therefore the erasure controller 222 inactivates the signal ERSB to prevent the voltage Vers from being applied.

On the other hand, the erasure controller 222 inactivates the signal SLA and activates the signal ERSA, to apply the erasing voltage to the stabilizing capacitance block 240A. The stabilizing capacitance block 240A is supplied with the erasing control gate voltage VersA from the erasure controller 222, instead of the voltages Vcg1A and Vcg2A upon the ordinary operation, to erase the write states of the flash memory cells in the stabilizing capacitance block 240A (Step S128). The erasing operation of the write states is as described above, and therefore details thereof is omitted.

In this case, the flash memory cells 51 and 52 sharing the floating gate are subjected to only weak write, and therefore the MOS transistor 54 is set to an ON state. For this reason, the erasing operation can be performed without controlling the erasing transistor 55 or 56 shown in FIG. 9 or 10, and therefore the transistor is omitted in FIG. 12. It should be noted that, in the case of mounting the transistor 55, the transistor 55 is controlled based on the signal ERS (in this case, the signal ERSA) to set an ON state, and therefore the erasing operation is more surely performed.

The above steps are repeated for all stabilizing capacitance blocks 240 (Step S130—No). In this case, the determination result is then read (Step S124), and it is checked that the stabilizing capacitance block 240B is an assembly of good capacitance units 40 (Step S126—Yes).

The stabilizing capacitance block 240A receives the output of the voltage boosting section 11 to perform the ordinary operation, and performs the erasing operation (refreshing operation) on the flash memory cells of the stabilizing capacitance block 240B with a stabilized voltage therefrom in the same manner as that for the stabilizing capacitance block 240A (Step S128). The erasing operation (refreshing operation) on the flash memory cells are sequentially performed, and if the erasing operation on good capacitance units is completed (Step S130—Yes), the signals CPP and SLA/B are activated, and signals ERSA/B are inactivated, so that the stabilizing section 220 is set to the ordinary operation mode to perform the stabilizing operation (Step S132).

As described, the voltage generated by the charge pump circuit under the operation state is used to erase the write states in the stabilizing capacitance blocks 240A/B that are determined to be good. The stabilizing capacitance block that is performing smoothing cannot perform the erasing operation of write states. For this reason, a part of the stabilizing capacitance blocks is separated from the smoothing operation, and the erasing operation on the flash memory cells in the separated stabilizing capacitance block part is performed with use of a voltage smoothed by another stabilizing capacitance block. The erasing operation may be performed for each of a plurality of capacitance units (each of the stabilizing capacitance blocks 240A/B) as described above, or can also be performed on the basis of the capacitance unit 40 with the separated stabilizing capacitance block being further segmentalized. Also, the write level determination voltages TM and Vmid* have been described in the above as different voltages, but may be the same voltage.

Figure 13:
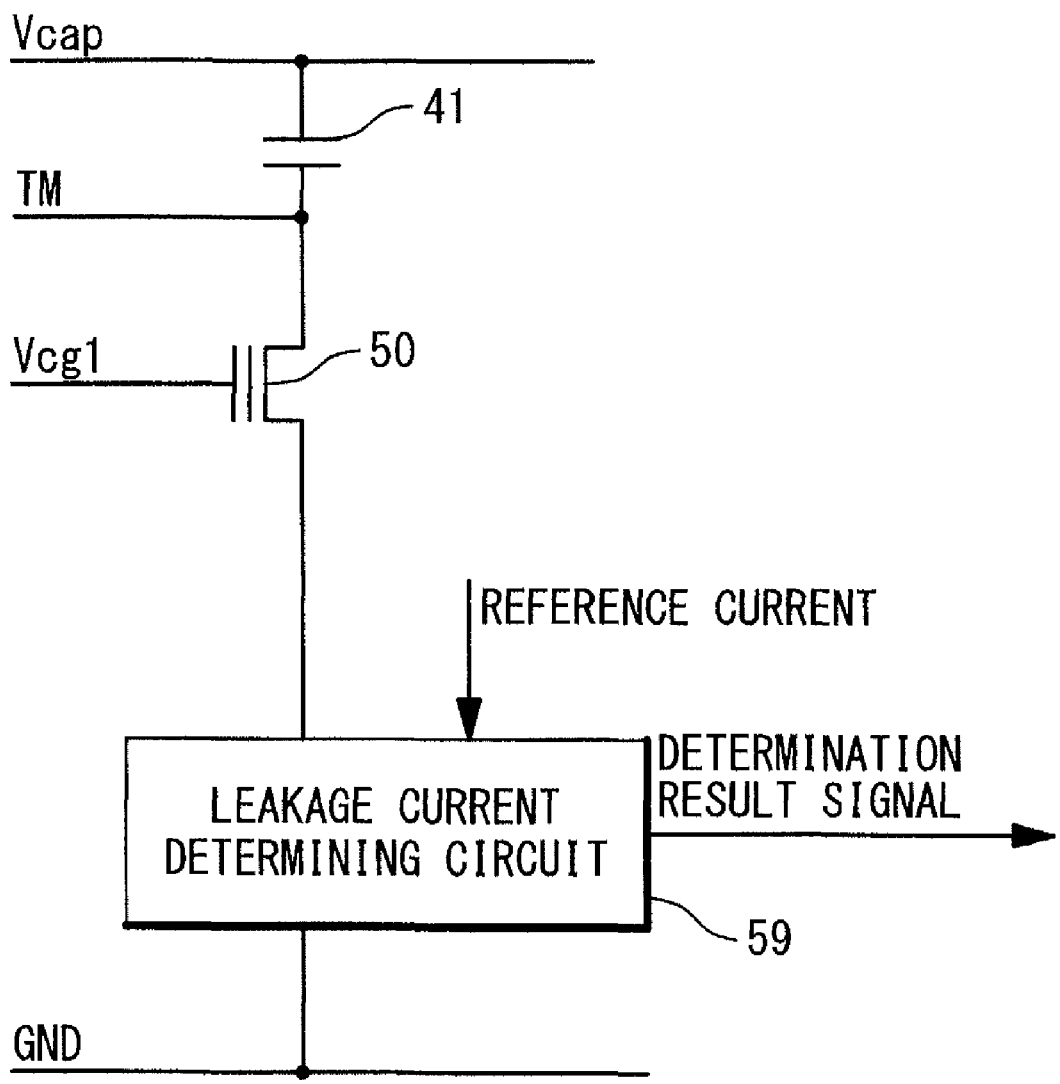
FIG. 13 is a circuit diagram illustrating a configuration of the capacitance unit according to the third embodiment of the present invention.

Also, in the case of the capacitance unit described in the first embodiment, such a refreshing operation can be performed by providing the leakage current determining circuit 59, as illustrated in FIG. 13.

As described, according to the present invention, a semiconductor device can be provided in which a defective capacitance element can be separated autonomously in high accuracy, so as to ensure reliability, by means having a high affinity to a process for manufacturing a flash memory. In particular, the present invention is preferable for a semiconductor device requiring a large capacitance element.

Although the present invention has been described above in connection with several embodiments thereof, it would be apparent to those skilled in the art that those embodiments are provided solely for illustrating the present invention, and should not be relied upon to construe the appended claims in a limiting sense.

What is claimed is:

1. A semiconductor device comprising a plurality of capacitance units connected in parallel between a first voltage and a second voltage,
wherein each of said plurality of capacitance units comprises:
a capacitance element connected with said first voltage; and
a capacitance disconnecting circuit connected between said second voltage and said capacitance element, and
wherein said capacitance disconnecting circuit comprises a non-volatile memory cell with a threshold voltage changed based on a change of a leakage current which flows from said capacitance element, and blocks off said leakage current based on a rise of the threshold voltage of said non-volatile memory cell when said leakage current exceeds a predetermined value.

2. The semiconductor device according to claim 1, wherein said capacitance disconnecting circuit further comprises a disconnection transistor,
wherein said non-volatile memory cell comprises a first memory cell and a second memory cell which shares a floating gate,
wherein said first memory cell is connected in series between said capacitance element and said disconnection transistor, and is set to a write state when said leakage current flows through said capacitance element, and
wherein said second memory cell is connected with a gate of said disconnection transistor, and controls said disconnection transistor to block off said leakage current when said first memory cell is set to the write state.

3. The semiconductor device according to claim 2, wherein said capacitance disconnecting circuit further comprises a bias resistance element connected between the gate of said disconnection transistor and said second voltage to supply a bias voltage to said disconnection transistor.

4. The semiconductor device according to claim 2, wherein said capacitance disconnecting circuit further comprises an erasure transistor connected in parallel to said disconnection transistor, and
wherein when said capacitance disconnecting circuit is initialized, said erasure transistor sets a connection node between said first memory cell and said disconnection transistor to said second voltage.

5. The semiconductor device according to claim 3, wherein said capacitance disconnecting circuit further comprises an additional transistor connected in series between the gate of said disconnection transistor and said bias resistance element,
wherein when said capacitance disconnecting circuit is initialized, said additional transistor sets a connection between said second memory cell and said bias resistance element to an open state.

6. The semiconductor device according to claim 2, wherein said first memory cell and said second memory cell are a flash memory which shares the floating gate.

7. The semiconductor device according to claim 1, wherein said capacitance disconnecting circuit further comprises:
a leakage current determining circuit configured to determine whether or not a test leakage current which flows through said non-volatile memory cell when a voltage for measurement is applied to said capacitance disconnecting circuit exceeds a predetermined reference current, and
wherein the initialization is performed on said non-volatile memory cell in which it is determined by said leakage current determining circuit that said test leakage current has exceeded said reference current.

8. A charge pump circuit comprising:
a plurality of capacitance units connected in parallel between a first voltage and a second voltage; and
a voltage boosting circuit configured to boost a voltage to a predetermined voltage based on a third voltage,
wherein each of said plurality of capacitance units comprises:
a capacitance element connected with said first voltage; and
a capacitance disconnecting circuit connected between said second voltage and said capacitance element,
wherein said capacitance disconnecting circuit comprises a non-volatile memory cell with a threshold voltage changed based on a change of a leakage current which flows from said capacitance element, and when the leakage current exceeds a predetermined value, said capacitance disconnecting blocks off the leakage current based on a rise of the threshold voltage of said non-volatile memory cell, and
wherein said plurality of capacitance units smooth an output voltage of said voltage boosting circuit.

9. The charge pump circuit according to claim 8, wherein said capacitance disconnecting circuit further comprises a disconnection transistor,
wherein said non-volatile memory cell comprises a first memory cell and a second memory cell which share a floating gate,
wherein said first memory cell is connected in series between said capacitance element and said disconnection transistor, and is set to a write state when said leakage current flows through said capacitance element, and
wherein said second memory cell is connected with a gate of said disconnection transistor, and controls said disconnection transistor to block off said leakage current when said first memory cell is set to the write state.

10. The charge pump circuit according to claim 9, wherein said capacitance disconnecting circuit further comprises a bias resistance element connected between the gate of said disconnection transistor and said second voltage to supply a bias voltage to said disconnection transistor.

11. The charge pump circuit according to claim 10, wherein said capacitance disconnecting circuit further comprises an erasure transistor connected in parallel to said disconnection transistor, and
wherein when said capacitance disconnecting circuit is initialized, said erasure transistor sets a connection node between said first memory cell and said disconnection transistor to said second voltage.

12. The charge pump circuit according to claim 10, wherein said capacitance disconnecting circuit further comprises an additional transistor connected in series between the gate of said disconnection transistor and said bias resistance element, and
wherein when a said capacitance disconnecting circuit is initialized, said additional transistor sets a connection between said second memory cell and said bias resistance element to an open state.

13. The charge pump circuit according to claim 9, wherein said first memory cell and said second memory cell are a flash memory which shares the floating gate.

14. The charge pump circuit according to claim 8, wherein said capacitance disconnecting circuit further comprises:
a leakage current determining circuit configured to determine whether or not a test leakage current which flows through said non-volatile memory cell when a voltage for measurement is applied to said capacitance disconnecting circuit exceeds a predetermined reference current, and wherein the initialization is performed on said non-volatile memory cell in which it is determined by said leakage current determining circuit that said test leakage current has exceeded said reference current.

15. The charge pump circuit according to claim 8, wherein said voltage boosting circuit comprises a plurality of voltage boosting units configured to operate based on a first clock signal and a second clock signal, wherein each of said plurality of voltage boosting units comprises:

a voltage boosting capacitance element configured to hold a voltage to be boosted;

first and second transistors connected in series between an input voltage of said voltage boosting unit and said second voltage; and third and fourth transistors connected in series between said third voltage and an output voltage of said voltage boosting unit, wherein said voltage boosting capacitance element is connected between a connection node between said first transistor and said second transistor and a connection node between said third transistor and said fourth transistor, and wherein said first transistor and said fourth transistor are driven in response to said first clock signal, and said third transistor and said second transistor are driven in response to said second clock signal.

16. The charge pump circuit according to claim 8, further comprising:

an initialization voltage supplying section configured to generate a voltage to initialize said capacitance disconnecting circuit, wherein one of said plurality of capacitance units which is not set to the write state is selected and initialized.

17. A function maintaining method in a semiconductor device which comprises a plurality of capacitance units connected in parallel between a first voltage and a second voltage, said function maintaining method comprising:

charging and discharging a plurality of capacitance elements;

detecting whether a leakage current which exceeds a predetermined current through a defective capacitance element of said plurality of capacitance elements has flowed;

disconnecting said defective capacitance element by opening a switch which blocks off said leakage current, when detecting that said leakage current has flowed; and initializing by closing the switch before said semiconductor device is used.

18. The function maintaining method according to claim 17, wherein said switch comprises a flash memory cell.

* * * * *